United States Patent
Hsu et al.

(10) Patent No.: US 7,053,638 B2
(45) Date of Patent: May 30, 2006

(54) SURROUNDING STRUCTURE FOR A PROBE CARD

(75) Inventors: Chi-Hsing Hsu, Taipei Hsien (TW); Jimmy Hsu, Taipei Hsien (TW)

(73) Assignee: VIA Technologies Inc., Taipei Hsien (TW)

( * ) Notice: Subject to any disclaimer, the term of this patent is extended or adjusted under 35 U.S.C. 154(b) by 0 days.

(21) Appl. No.: 10/982,919

(22) Filed: Nov. 8, 2004

(65) Prior Publication Data

US 2005/0253604 A1    Nov. 17, 2005

(30) Foreign Application Priority Data

May 14, 2004  (TW) ............................ 93207600 U

(51) Int. Cl.
*G01R 31/02*    (2006.01)

(52) U.S. Cl. .......................................... 324/754

(58) Field of Classification Search ................ None
See application file for complete search history.

(56) References Cited

U.S. PATENT DOCUMENTS

| | | | | |
|---|---|---|---|---|
| 4,523,144 A | * | 6/1985 | Okubo et al. | 324/762 |
| 4,719,417 A | * | 1/1988 | Evans | 324/762 |
| 5,670,889 A | * | 9/1997 | Okubo et al. | 324/760 |
| 6,137,297 A | * | 10/2000 | McNair et al. | 324/754 |
| 6,515,358 B1 | * | 2/2003 | Dass et al. | 257/684 |

* cited by examiner

*Primary Examiner*—Vinh Nguyen
*Assistant Examiner*—Richard Isla-Rodas
(74) *Attorney, Agent, or Firm*—Birch, Stewart, Kolasch & Birch, LLP

(57) ABSTRACT

A surrounding structure of a probe card is described, and particularly an isolator unit, which is formed by filling in a wire leading region with epoxy material to substitute for an originally clear portion, so as to improve high impedance characteristics of the cross-over portion by using the resultant parasitic capacitance effect, and improve the compensation for the purpose of impedance matching. Additionally, the energy loss is reduced and the application frequency range is widened.

8 Claims, 6 Drawing Sheets

| Type | S11 | | S21 | | |
|---|---|---|---|---|---|
| | 100MHz | 1 GHz | 100MHz | 1 GHz | F @ 3dB |
| Case A | -15.03 | -1.27 | -0.18 | -6.17 | 560MHz |
| Case B | -16.79 | -2.12 | -0.14 | -4.43 | 720MHz |

| | S11 | | S21 | | |
|---|---|---|---|---|---|
| Type | 100MHz | 1 GHz | 100MHz | 1 GHz | F @ 3dB |
| Case A | -15.03 | -1.27 | -0.18 | -6.17 | 560MHz |
| Case B | -16.79 | -2.12 | -0.14 | -4.43 | 720MHz |
| Case C | -21.50 | -5.52 | -0.09 | -1.82 | 1.38GHz |

SURROUNDING STRUCTURE FOR A PROBE CARD

BACKGROUND OF THE INVENTION

1. Field of the Invention

This invention relates to a surrounding structure of a probe card, and more particularly to an isolator unit, which is formed by filling in a wire leading region with epoxy material to substitute for an originally clear portion, so as to improve high impedance characteristics of the cross-over portion by using the resultant parasitic capacitance effect, and improve the compensation for the purpose of impedance matching.

2. Description of the Prior Art

After the completion of wafer manufacturing, a wafer test is required to guarantee the functions of the products. The wafer test is performed by using a test device and a probe card to test each die on a wafer, in order to confirm that the electrical characteristics and performances of the die are in accordance with the design specifications. As chip function becomes more sophisticated, the high-speed and accurate test requirement is more significant.

In the circumstance, a probe card is used for the wafer test of semiconductor integrated circuits, which is very critical especially in the test stage of RF (radio frequency) wafer-level mass production. The application is to perform functional tests on bare die by the probe before packaging of integrated circuits, to screen out the defectives and then proceed to further packaging fabrication.

The test process begins with locating a die on a wafer on the test device. The probe card is mounted on the test device, so as to have the contact pads on the die aligned and touched with the probe.

Reference is made to FIGS. 1 and 2, which are respectively top and cross-sectional views of a commercially available epoxy probe card. A probe card 9 comprises a circuit board 92, and hundreds of probes 90. The circuit board 92 has an isolation locking ring 94 which is extending along the lower surface thereof. The probes 90 are fixed on the isolation locking ring 94 of the probe card 9 by means of epoxy element 96. The probes 90 are electrically connected to the circuit board 92, and electrically connected individually to the metal pads 84 on the die 82 of a wafer. The probes 90 are used to contact the pads 84 on the die 82, so as to directly input signals or read the output values to or from the die 82.

During the one-by-one detection of wafer testing, if any die 82 does not pass the test, it is marked as defective. Consequently, during chip dicing and separation, these dies which are marked as defective are screened out and excluded from further packaging fabrication. As a result of the wafer test, the dies that pass the test proceed to the next stage of packaging fabrication.

However, in the design of a conventional epoxy probe card 9, since the wiring portion is far away from the ground wire 93 (distributed over the surface of the circuit board 92), the loop inductance produced becomes large and the problem of impedance mismatching becomes worse. Meanwhile, the dielectric medium 98 between the signal wire 91 and the ground wire 93 is air, the electrical field dissipates in the air, and thus power consumption becomes large when the frequency is increased.

Reference is made to FIG. 3, which is a frequency response graph of a simulation test for the conventional epoxy probe card; FIG. 3A is a frequency response comparison table of S11 and S21 against 3 dB. The simulation test makes comparison between two cases; Case A is a case where the signal wire is far away from the ground wire and Case B is a case where the signal wire is near the ground wire. S11 illustrates the fact that test signals are rebounded due to impedance mismatching, and a value thereof is closer to minus infinite dB is better. S21 illustrates the fact that all testing signals completely pass without any loss, and a value thereof is closer to 0 dB is better. The values are obtained in dB corresponding to the frequency response S11 and S21 of the simulation test to give the graph of FIG. 3. From the graph, it can be found that once the leading wire crosses over that wire, the corresponding return loss decreases with the increase of the frequency, thus resulting in serious signal reflection. In a high frequency band, the corresponding insertion loss will become large; the frequency width corresponding to 3 dB is only about 560–720 MHz. With this structure, under high frequency, the signal loss is quite serious, such that no energy is delivered. In particular, as the speeds of electrical products are increasingly refreshed and there is increased need for high speed, this condition more urgently requires improvement.

Accordingly, there is a need to improve the above inconvenience and disadvantage of the conventional probe card in the actual application.

Accordingly, this invention is provided to improve the above disadvantages with a reasonable design.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

SUMMARY OF THE INVENTION

The present invention provides a surrounding structure for a probe card which improving the assembling way of epoxy probe card for enhancing the characteristics of signals passing this test interface, such as the electric characteristics and the impedance matching.

The present invention provides a surrounding structure for a probe card having a circuit board, an isolation locking ring, a plurality of signal wires, a plurality of probes, and a dielectric medium. The isolation locking ring is extending downward along a lower surface of the circuit board. The signal wires are electrically connected to the circuit board. The probes are electrically connected individually to corresponding signal wires. The dielectric medium is fixed on the isolation ring of the probe and surrounding the signal wires and a predetermined portion of the lower surface of the circuit board.

DETAILED DESCRIPTION OF THE EMBODIMENTS

Figure 1:
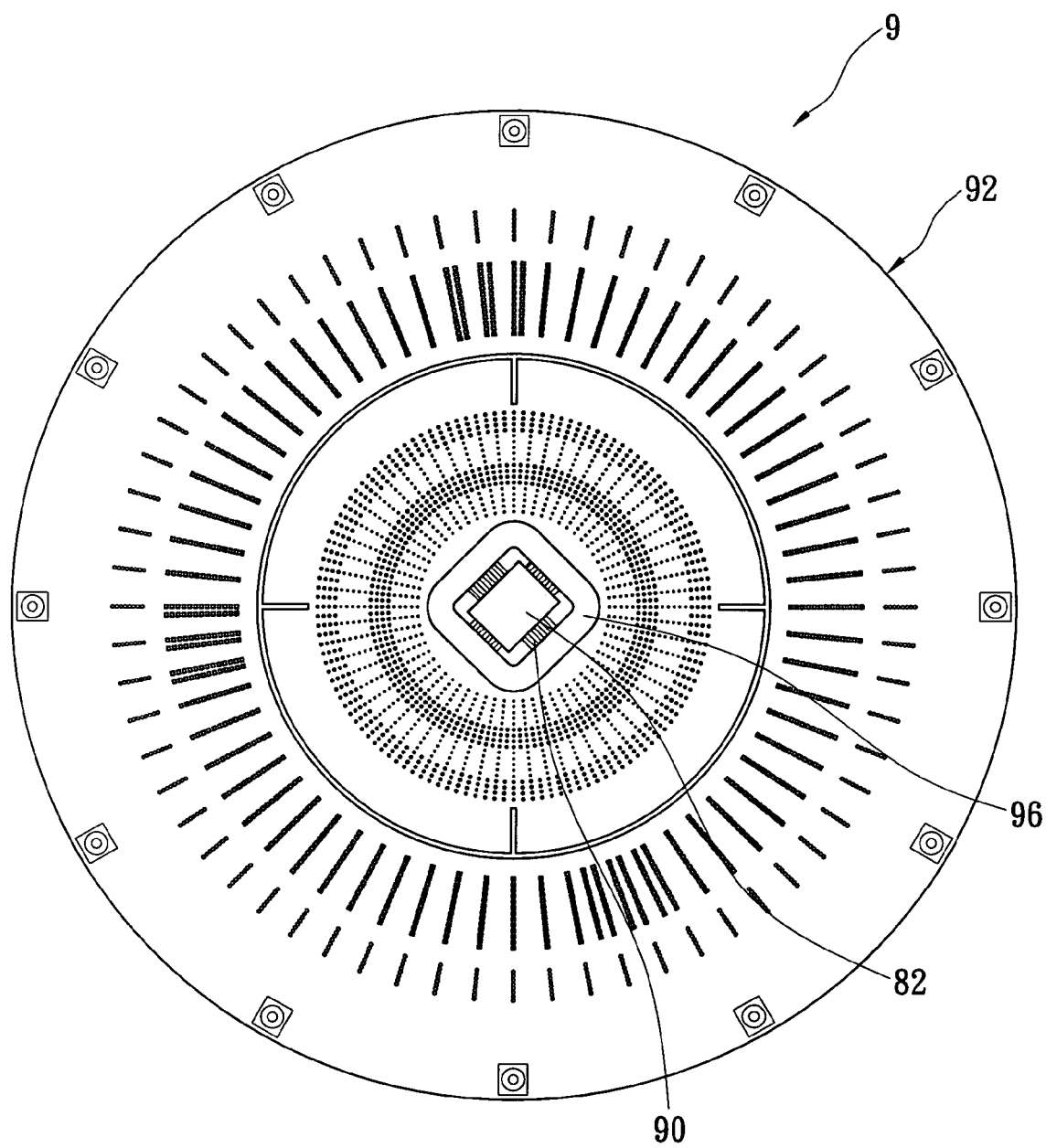
FIG. 1 is a top view of a conventional epoxy probe card.
Figure 2:
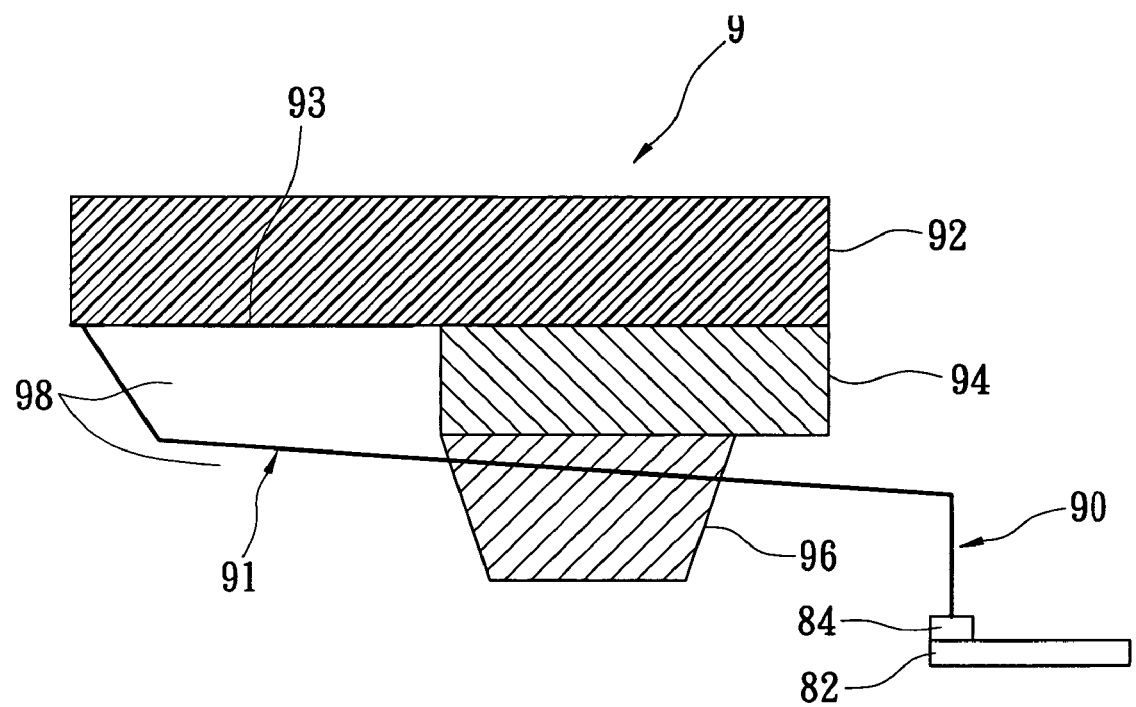
FIG. 2 is a cross-sectional view of the conventional epoxy probe card.
Figures 3, 3A:
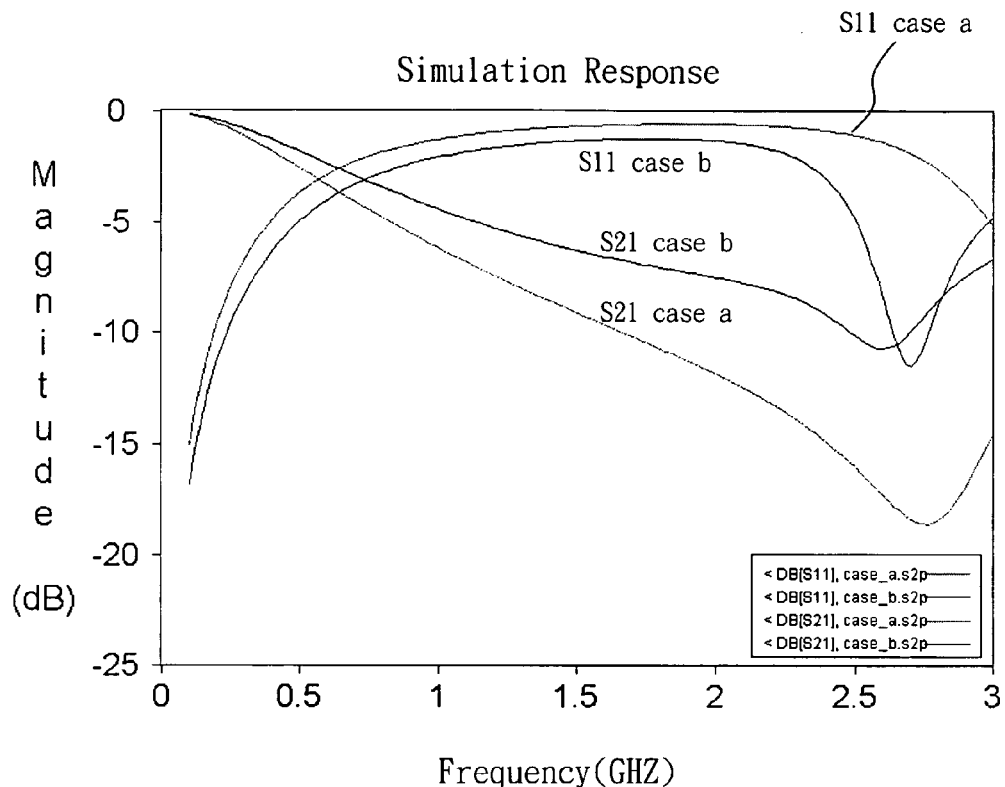
FIG. 3 is a frequency response graph of the conventional epoxy probe card.
FIG. 3A is the frequency response comparison table of S11 and S21 against 3 dB according to FIG. 3.
Figure 4:
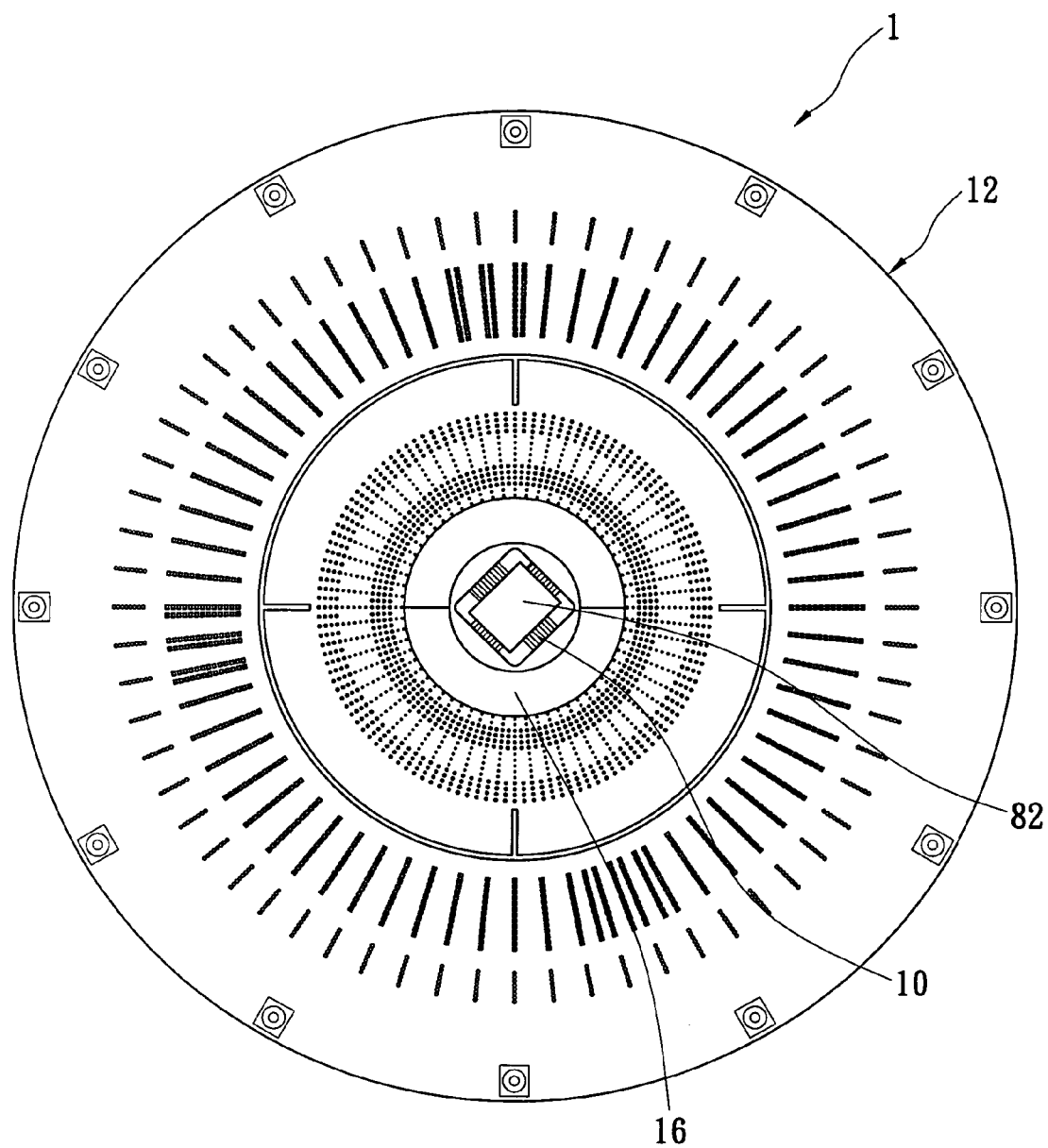
FIG. 4 is a top view of a probe card according to the present invention.
Figure 5:
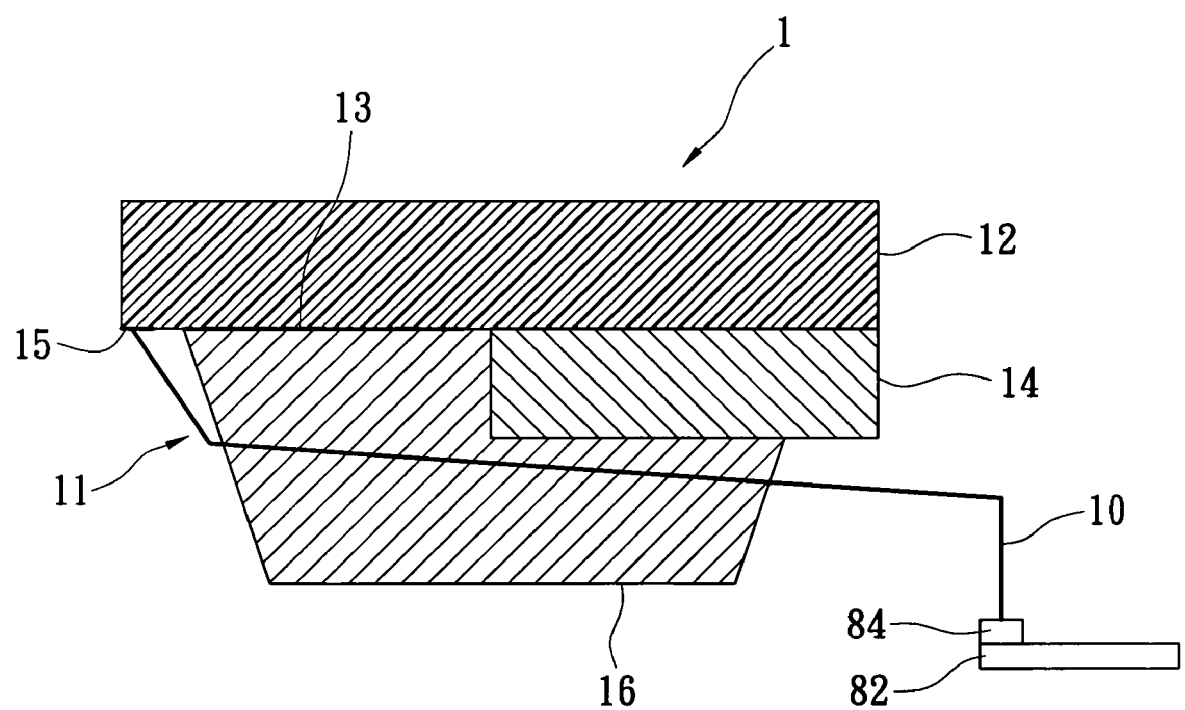
FIG. 5 is a cross-sectional view of the probe card according to the present invention.

Reference is made to both of FIGS. 4 and 5, top and cross-sectional views, respectively, of one embodiment of a probe card according to the present invention. The probe card 1 comprises a circuit board 12, an isolation locking ring 14 which is extending downward along the lower surface of the edge of the circuit board 12, and a plurality of probes 10 which are electrically connected to the circuit board 12, and a dielectric medium 16 which is fixing the probes 10 on the isolation locking ring 14. The circuit board 12 has ground wires 13 and signal contacts 15 on a lower surface thereof.

In order to improve the connecting mode of the epoxy probe card, the connection path from the test device to the die 82 to be tested begins with the signal route of the probe card 1, and then goes through the connecting wire (generally made of wolfram or wolfram alloy), i.e., signal wire 11, and finally arrives at the die 82. The structure can be divided into two parts: one is the circuit board 12 of the probe card 1, and the other is the portion of the signal wire 11. In the structure portion of the circuit board 12 of the probe card 1, impedance control and high-speed and high-frequency signal transmission can be achieved with an appropriate lamination and ground/power layer design. But in the portion of the signal wire 11, the signal contacts 15 of the probe card 1 extends to the contact pad 84 of the die 82. For the signal quality of this portion, it is required that the impedance matching should be designed well to alleviate the signal reflection between both ends due to the problem of impedance mismatching, thereby avoiding the influence on signal transmission.

According to the above analysis, this invention is characterized by improving the surrounding structure of the probe card, and particularly providing the dielectric medium 16 which is fixing a large portion of the signal wires 11 of the probe 10, and covering the isolation locking ring 14 and a ground wire portion 13 of the circuit board 12. In place of air used as the dielectric medium in the conventional probe card, the dielectric medium 16 with a higher dielectric constant than that of the air (for example, epoxy resin) is used, thereby avoiding the electrical field dissipating in the air and making it possible that the loss does not increase as the frequency is rising. Therefore, when the signal wire crosses over the area without wires, the resultant impedance mismatching condition can be compensated by the dielectric medium surrounding the signal wire and ground wire. The dielectric medium can be an epoxy or a similar isolation material. Thus the parasitic capacitance effect of the portion is applied to improve the high impedance effect of the cross-over portion, thereby achieving impedance matching and alleviating the energy dissipation to the air.

The electrical field dissipation to the air can be prevented effectively, as long as the dielectric medium 16 according to the invention covers a slightly larger area than that of the conventional structure coverage. For example, covering a portion of the circuit board 12 partially or wholly. When the dielectric medium 16 partially covers the circuit board 12, the probes 10 can still be replaced since the signal contacts 15 are not surrounded. As a result, the coverage area can either extend from the lower surface of the isolation locking ring 14 to the end of the signal wire 11, i.e., in front of the signal contacts 15, or extend to cover the signal contacts 15.

Figures 6, 6A:
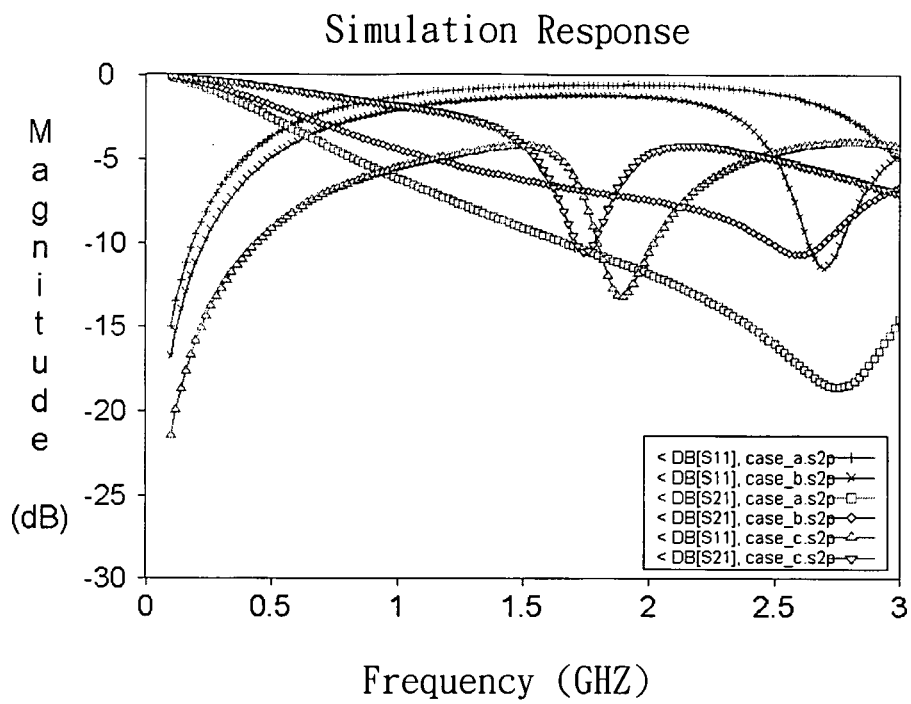
FIG. 6 is a simulation frequency response graph showing the cross-over curves S11 and S21 of the invention and the conventional structure.
FIG. 6A is the frequency response comparison table of S11 and S21 against 3 dB according to FIG. 6.

Reference is made to FIG. 6, which is a simulation frequency response graph showing the cross-over curves S11 and S21 of the invention and the conventional structure. FIG. 6A is the data comparison table according to FIG. 6. This invention carries out the improvement of the probe based on the structure of FIGS. 4 and 5. The impedance is calculated by the equivalent approximate formula $(L/C)^{1/2}$, where L is the equivalent inductance and C is the equivalent capacitance; therefore to reduce the impedance, it is necessary to reduce L value and increase C value. The dielectric constants of the air and epoxy are 1 and about 3.5, respectively; this significantly increases the value of C.

This invention is characterized by use of an isolation material with a high dielectric constant, for example epoxy resin, as a dielectric medium to surround the signal wire and ground wire, to enhance an useful capacitance effect. With the parasitic capacitance effect, this facilitates cross over of its own high impedance to achieve the purpose of impedance matching. Additionally, with epoxy resin or a similar isolation material surrounding the signal wire and ground wire, the distribution of the electrical field is suppressed and prevented from energy loss due to dissipation in the air.

According to this invention, the dielectric medium with a higher dielectric constant is used in place of air as the dielectric medium of the conventional probe card, thereby avoiding the electrical field dissipating in the air and making it possible that the loss does not increase as the frequency is rising. In this way, the return loss is improved, the condition of impedance mismatching is alleviated, the insertion loss is reduced, and the frequency bandwidth corresponding to 3 dB is widened to have an effective application frequency bandwidth thereof doubled, so as to facilitate the transmission of high-frequency and high-speed signals.

This invention thus has the following advantages:

1. The return loss during signals passing through the wires is improved, thus alleviating the problem of impedance mismatching.

2. The insertion loss of high-frequency is reduced and the effective frequency bandwidth corresponding to 3 dB is widened, thereby enabling the high-frequency signal to be transmitted entirely and reducing the energy loss.

3. The application range of test frequencies of the epoxy resin probe card is widened and the quality of the transmitted signal is improved.

In conclusion, this invention fully meets the requirements for the patent application. Therefore, The application is proposed according to the patent law. While the preferred embodiments of this invention have disclosed above, they are not indented to limit the scope of this invention. Therefore the appended claims cover all such changes or modifications as fall within the spirit and scope of this present invention.

What is claimed is:

1. A surrounding structure for a probe card, comprising:
   a circuit board having a plurality of ground wires and a plurality of signal contacts distributed on a lower surface thereof;
   an isolation locking ring, extending downward along a lower surface of the circuit board;
   a plurality of signal wires, electrically connected to the circuit board;
   a plurality of probes, electrically connected repectively to the corresponding signal wires; and
   a dielectric medium, fixed on the isolation locking ring of the probe and surrounding the signal wires, the dielectric medium covering a predetermined portion of the lower surface of the circuit board and covering the ground wires fully.

2. The surrounding structure for the probe card according to claim 1, wherein the dielectric medium extends along the signal wires from a lower surface of the isolation locking ring to the lower surface of the circuit board and wherein the signal contacts are outside the dielectric medium and are exposed to air.

3. The surrounding structure for the probe card according to claim 1, wherein the dielectric medium extends along the signal wires from a lower surface of the isolation locking ring to the lower surface of the circuit board, and the signal contacts are covered by the dielectric medium.

4. The surrounding structure for the probe card according to claim 1, wherein the dielectric medium is an electrical isolation material with a higher dielectric constant than that of the air.

5. The surrounding structure for the probe card according to claim 1, wherein the dielectric medium is epoxy resin.

6. A surrounding structure for a probe card, comprising:
  a circuit board having a plurality of ground wires and a plurality of signal contacts arranged on a lower surface thereof;
  an isolation locking ring, extending downward along a lower surface of the circuit board;
  a plurality of signal wires, electrically connected to the circuit board;
  a plurality of probes, electrically connected individually to corresponding signal wires; and
  an epoxy resin, fixed on the isolation locking ring of the probe and surrounding the signal wires, the dielectric medium covering a predetermined portion of the lower surface of the circuit board and covering the ground wires fully.

7. The surrounding structure for the probe card according to claim 6, wherein the epoxy resin extends along the signal wires, beginning from a lower surface of the isolation locking ring to the lower surface of the circuit board, and wherein the signal contacts are outside of the dielectric medium and are exposed to air.

8. The surrounding structure for the probe card according to claim 6, wherein the epoxy resin extends along the signal wires, from a lower surface of the isolation locking ring to the lower surface of the circuit board, and the signal contacts are covered by the dielectric medium.

* * * * *